United States Patent [19]
Lo et al.

[11] Patent Number: 5,783,097
[45] Date of Patent: Jul. 21, 1998

[54] PROCESS TO AVOID DIELECTRIC DAMAGE AT THE FLAT EDGE OF THE WATER

[75] Inventors: Chi-Shen Lo; Chao-Hsin Chang; Chia-Hsiang Chen; Hsien-Wen Chang; Chih-Heng Shen, all of Hsin-Chu, Taiwan

[73] Assignee: Taiwan Semiconductor Manufacturing Company, Ltd., Hsinchu, Taiwan

[21] Appl. No.: 871,503

[22] Filed: Jun. 9, 1997

[51] Int. Cl.[6] .......................... H01L 21/00; C03C 15/00
[52] U.S. Cl. .......................... 216/41; 216/97; 216/99; 438/756
[58] Field of Search .......................... 216/2, 41, 46, 216/92, 97, 99; 438/756

[56] References Cited

U.S. PATENT DOCUMENTS

| | | | |
|---|---|---|---|
| 4,510,176 | 4/1985 | Cuthbert et al. | 427/82 |
| 4,732,785 | 3/1988 | Brewer | 427/240 |
| 5,168,021 | 12/1992 | Arai et al. | 430/22 |
| 5,328,871 | 7/1994 | Tanigawa et al. | 438/756 X |
| 5,425,846 | 6/1995 | Koze et al. | 156/646.1 |

*Primary Examiner*—William Powell
*Attorney, Agent, or Firm*—George O. Saile; Stephen B. Ackerman; Larry J. Prescott

[57] ABSTRACT

A simple, non critical, low cost process step is added to the manufacture of integrated circuit wafers to remove a ridge of dielectric material remaining at the flat edge of the wafer after an edge rinse has removed the ridge of dielectric from the circular edges of the wafer. A layer of dielectric, such as Spin-On-Glass or the like, is formed on the wafer. An edge rinse is then used to remove the ridge of dielectric formed at the wafer edge, however the edge rinse does not remove the ridge of dielectric at the flat edge of the wafer. A layer of photoresist is formed on the wafer, selectively exposed, and developed to form a photoresist mask. The flat edge of the wafer is then dipped in buffered oxide etch to remove the dielectric material at the flat edge of the wafer. The photoresist mask is then stripped and processing of the wafer is continued. Damage to dielectric material at the flat edge of the wafer, which can cause particles to flake off and become a source of defects in subsequent process steps, in thereby avoided.

20 Claims, 5 Drawing Sheets

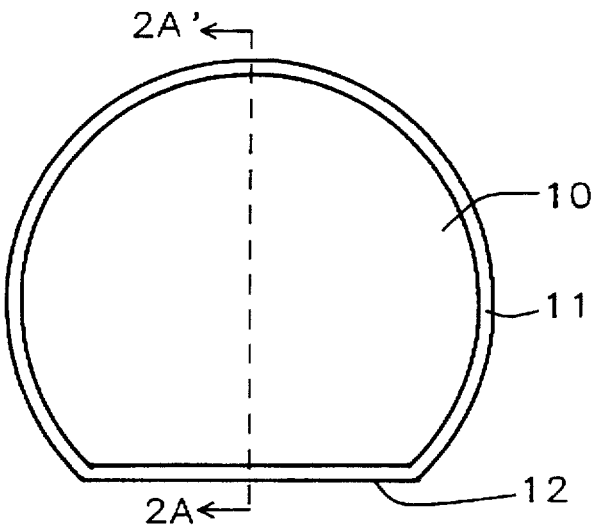
FIG. 1 - Prior Art
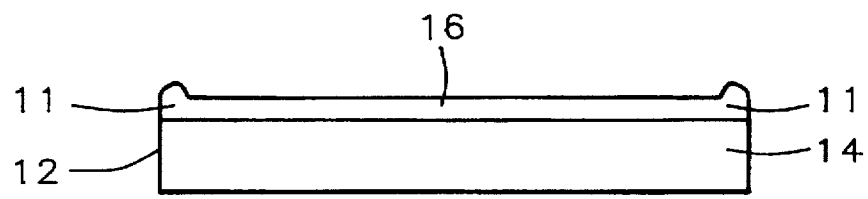
FIG. 2A - Prior Art
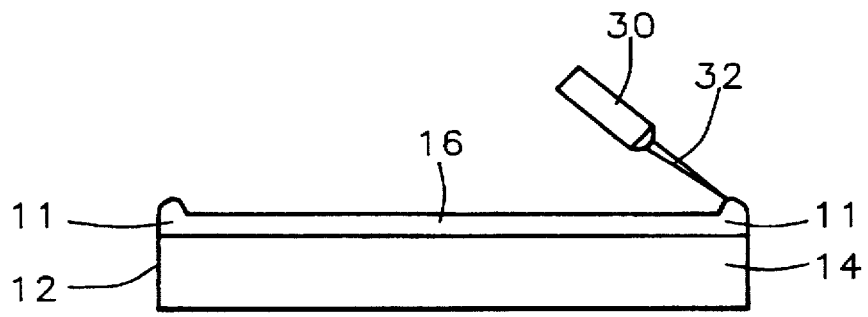
FIG. 2B - Prior Art

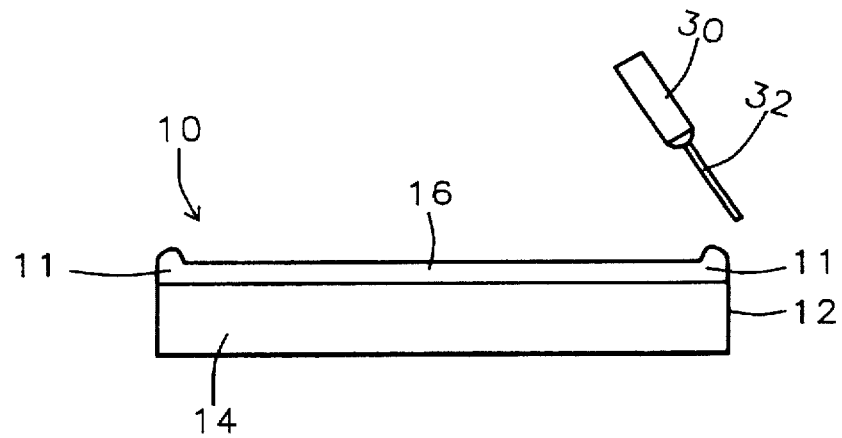
FIG. 2C — Prior Art
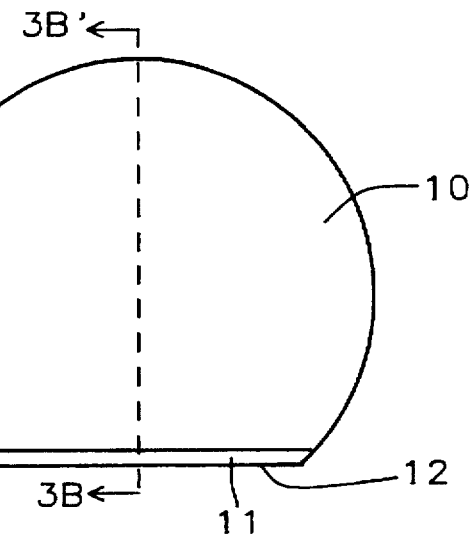
FIG. 3A — Prior Art
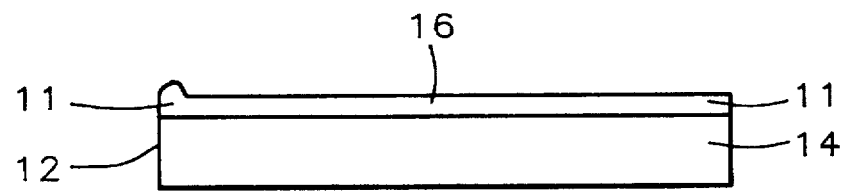
FIG. 3B — Prior Art

PROCESS TO AVOID DIELECTRIC DAMAGE AT THE FLAT EDGE OF THE WAFER

BACKGROUND OF THE INVENTION

1. Field of the Invention

This invention relates to a method for avoiding damage to dielectric material at the flat edge of the wafer and more particularly to a method for removing dielectric from a region at the flat edge of the wafer which does not contain active devices.

2. Description of the Related Art

This invention describes a method of avoiding damage to dielectric material at the flat edge of an integrated circuit wafer. The damaged dielectric material can flake off as particles which will adversely impact subsequent processing steps. The invention describes a method, using a photoresist mask and buffered oxide etch, for removing dielectric material from a non active region of the wafer parallel to the flat edge.

U.S. Pat. No. 5,425,846 to Koze et al. describes a method of removing perimeter material from a wafer by stacking wafers and subjecting them to a plasma etch.

U.S. Pat. No. 4,510,176 describes a method for removing the edge bead from a coated wafer by directing a jet of solvent at the wafer periphery while the wafer is spinning.

U.S. Pat. No. 4,732,785 to Brewer describes a method of removing the edge bead from films that are spun onto a planar wafer using a repeated application of a solvent on the edge of the wafer while the wafer is spinning and a specific deceleration spin to remove the bead.

U.S. Pat. No. 5,168,021 to Arai et al. shows a method of exposing the peripheral part of a wafer.

The methods described in these patents all differ from the method described in the present invention.

SUMMARY OF THE INVENTION

In the manufacture of integrated circuit wafers inter-metal dielectric layers or inter-level dielectric layers are often formed of brittle materials such as Spin-On-Glass, borophosphosilicate glass, silicon dioxide, or the like. Care must be taken to avoid that part of these materials at the edge of the wafer from being damaged by the handling and fixtures of subsequent process steps. Clamping fixtures used for etching has often been the cause of this damage which causes particles of the dielectric layer to flake off and become the source of defects during subsequent processing steps. The region of wafers along the flat edge of the wafer is particularly susceptible to this damage.

FIGS. 1–2D show the conditions leading to the problem of damage to the brittle dielectric at the flat edge of the wafer. FIG. 1 shows a top view of a wafer 10 having a single flat edge 12 and a circular edge 10. A layer of dielectric, such as Spin-On-Glass, is formed on the wafer surface. A layer of oxide may be formed on the wafer surface prior to the formation of the layer of Spin-On-Glass. The Spin-On-Glass layer forms a ridge 11 at the edge of the wafer. A cross section of the wafer along a line perpendicular to the flat edge is shown in FIG. 2A showing the integrated circuit wafer 14, the layer of Spin On-Glass 16, and the ridge of Spin-On-Glass 11 formed at the edge of the wafer. The oxide layer formed prior to the formation of the layer of Spin-On-Glass is not critical to the invention and is not shown.

In conventional wafer processing, as shown in FIGS. 2B and 2C, an edge rinse using a solvent such as isopropyl alcohol is used to remove the ridge 11 of Spin-On-Glass from the wafer. As shown in FIG. 2B a stream of solvent 32 is sprayed from a nozzle 30 onto the ridge 11 of Spin-On-Glass as the wafer is rotated. FIG. 2C illustrates the problem with this conventional method when the flat edge 12 of the wafer 14 comes under the stream 32 of solvent. At the flat edge 12 of the wafer 14 the solvent misses the ridge 11 of Spin-On-Glass, or other dielectric, and the ridge 11 of Spin-On-Glass 16 remains on the flat edge 12 of the wafer, as shown in FIGS. 3A and 3B. Subsequent process steps involve clamping the wafer from the top and damage to the ridge 11 of Spin-On-Glass 16 at the flat edge 12 of the wafer 14 will occur. This damage to the ridge 11 of Spin-On-Glass 16, or other dielectric, results in the chipping away of small particles from the dielectric layer. These particles will become sources of defects in subsequent process steps.

It is a principle objective of this invention to provide a method for removing the ridge of dielectric formed at the flat edge of a wafer and thereby eliminating the potential for chipping fragments of dielectric from the ridge of dielectric at the flat edge of the wafer.

This objective is achieved by adding process steps, after the dielectric layer has been formed and a solvent rinse has been used to remove the dielectric ridge from the circular edge of the wafer, whereby the dielectric ridge is removed from a band at the flat edge of the wafer. The process steps comprise forming a layer of photoresist on the wafer, selectively exposing the layer of photoresist, developing the layer of photoresist, and etching away the dielectric at the flat edge of the wafer using the developed layer of photoresist as a mask. The photoresist is then removed. The region of the wafer from which the dielectric material is removed does not include the active region of the wafer so that none of the devices on the wafer are affected by the lack of the dielectric layer. With the brittle dielectric material removed from the flat edge of the wafer the dielectric material will not be damaged by subsequent processing steps.

BRIEF DESCRIPTION OF THE DRAWINGS

FIG. 1 shows a top view of a wafer after formation of a dielectric layer.

FIG. 2A shows a cross section view of a wafer after formation of a dielectric layer showing a ridge of dielectric at the edge of the wafer.

FIG. 2B shows a cross section view of a wafer with a stream of solvent used to remove the ridge of dielectric from the circular edge of the wafer.

FIG. 2C shows a cross section view of a wafer with the flat edge of the wafer under the stream of solvent used to remove the ridge of dielectric.

FIG. 3A shows a top view of a wafer having a ridge of dielectric on the flat edge of the wafer.

FIG. 3B shows a cross section view of a wafer having a ridge of dielectric on the flat edge of the wafer.

DESCRIPTION OF THE PREFERRED EMBODIMENTS

Figure 4:
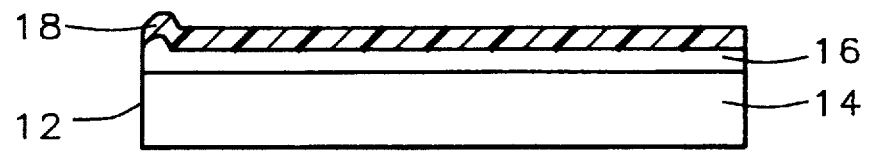
FIG. 4 shows a cross section view of a wafer having a layer of dielectric material formed on the wafer, a ridge of dielectric on the flat edge of the wafer, and a layer of photoresist formed on the wafer.

Refer now to FIGS. 1-8 for a description of the preferred embodiment of the method of this invention for removing the dielectric ridge from the flat edge of the wafer. FIGS. 1 and 2A show top and cross section views respectively of an integrated circuit wafer 14, having a single flat edge 12, after devices have been formed in the wafer and patterned layers of metal and insulators have been formed on the wafer. A layer of dielectric 16, such as spin-on-glass or the like, is then formed over the wafer. As shown in FIGS. 1 and 2A, a ridge 11 of dielectric 16 is formed at the edge of the wafer. Next, as shown in FIG. 2B, a stream 32 of solvent, such as isopropyl alcohol, is directed from a nozzle 30 to the ridge 11 of dielectric 16 at the edge of the wafer 14 as the wafer is spun under the stream 32 of solvent. The solvent rinses a band between about 0.5 and 4 millimeters from the edge of the wafer and removes the dielectric ridge from those regions of the wafer where the solvent strikes the dielectric ridge. However, as shown in FIG. 2C, at the flat edge 12 of the wafer 14 the stream 32 of solvent does not strike the ridge of dielectric. The ridge of dielectric 11 is thus removed from the circular edge of the wafer and remains at the flat edge of the wafer.

FIG. 3A shows a top view of the wafer after the solvent has removed the ridge of dielectric from the circular edge 10 of the wafer. As shown in FIG. 3A a ridge 11 of dielectric remains at the flat edge 12 of the wafer. FIG. 3B shows a cross section of the wafer after the solvent has removed the ridge of dielectric from the circular edge of the dielectric. The ridge 11 of dielectric 16 remaining at the flat edge 12 of the wafer 14 is also shown in FIG. 3B.

Figure 5:
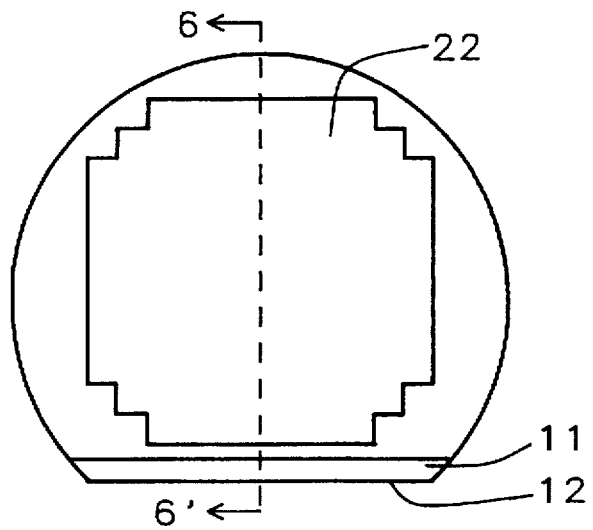
FIG. 5 shows a top view of a wafer with a ridge of dielectric at the flat edge of the wafer showing the active region of the wafer.
Figure 6:
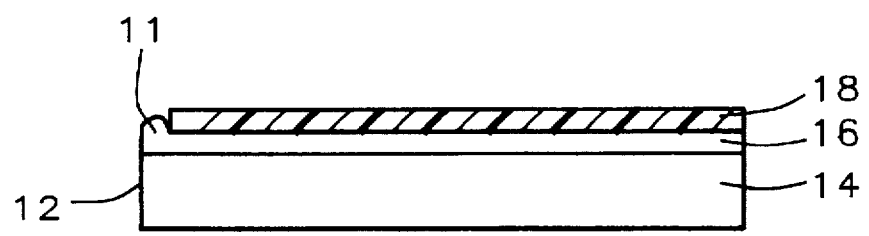
FIG. 6 shows a cross section view of a wafer with a ridge of dielectric at the flat edge of the wafer after a layer of photoresist has been exposed and developed thereby exposing the ridge of dielectric at the flat edge of the wafer.

As shown in FIG. 4, a layer of photoresist 18 is then formed on the wafer covering the layer of dielectric 16. The layer of photoresist is then selectively exposed and developed so that the photoresist is removed from the ridge of dielectric at the flat edge of the wafer, thereby forming a photoresist mask. FIG. 5 shows a top view of the wafer after the photoresist has been selectively exposed and developed, exposing the ridge 11 of dielectric at the flat edge 12 of the wafer. The active area 22 of the wafer is shown in FIG. 5 showing that the ridge 11 of dielectric does not cover the active area 22 of the wafer. FIG. 6 shows a cross section of the wafer 14 showing the developed photoresist 18, the dielectric layer 16, and the ridge 11 of dielectric at the flat edge 12 of the wafer 14.

Figure 7:
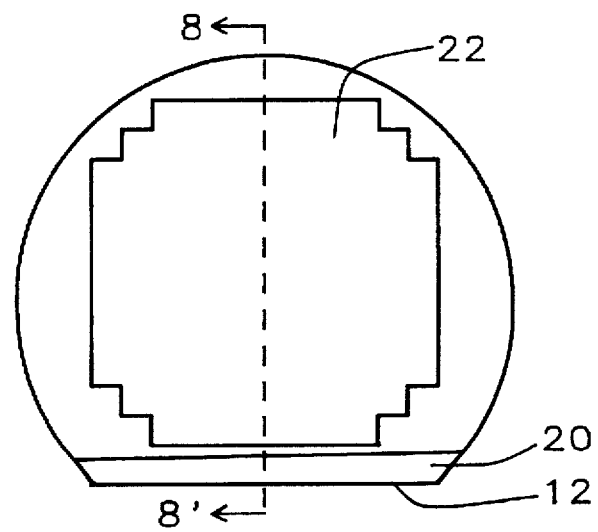
FIG. 7 shows a top view of a wafer showing the active region of the wafer and the region at the flat edge of the wafer where the dielectric material has been removed.
Figure 8:
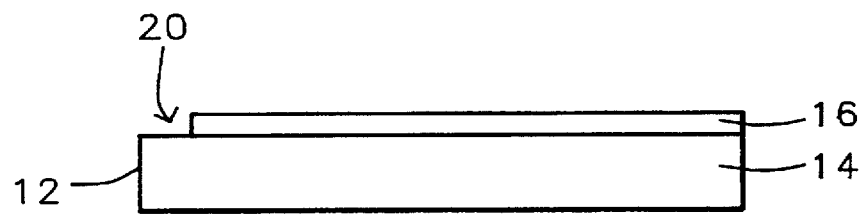
FIG. 8 shows a cross section view of a wafer showing the region at the flat edge of the wafer where the dielectric material has been removed.

The flat edge of the wafer is then dipped in a wet etchant, such as a 10:1 buffered oxide etch, to remove the dielectric at the flat edge of the wafer which is not covered by the photoresist mask. The photoresist is then stripped from the wafer. FIG. 7 shows a top view of the wafer after the dielectric has been removed from a band 20 at the flat edge 12 of the wafer. FIG. 7 shows that the dielectric has not been removed from the active area 22 of the wafer. FIG. 8 shows a cross section view of the wafer 14 after the dielectric 16 has been removed from a band 20 at the flat edge 12 of the wafer 14. Subsequent processing steps of the wafer can now be carried out without damage to the dielectric material and particles of dielectric will not be chipped away and become a source of defects.

Figure 9:
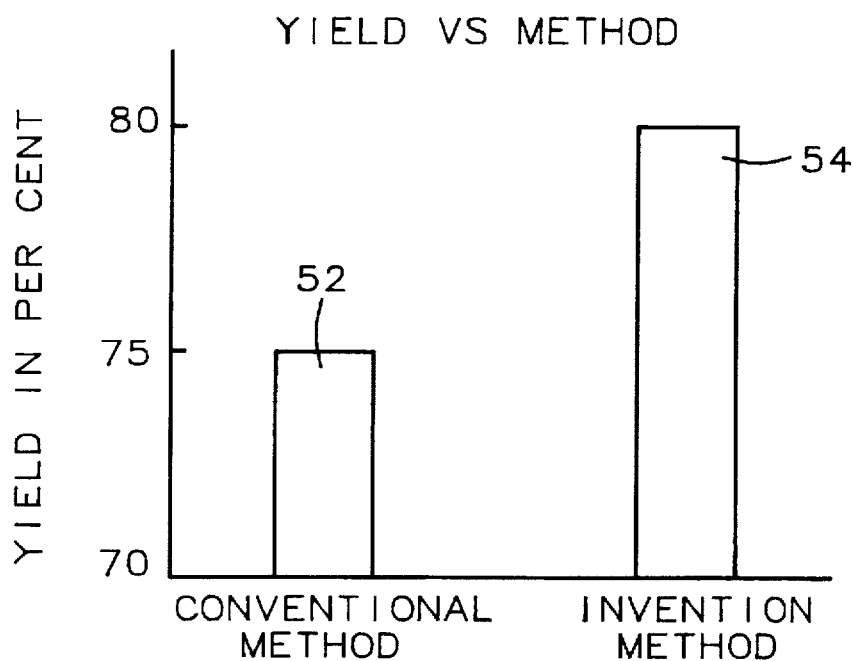
FIG. 9 shows a plot of wafer yield for different conditions of treating the dielectric ridge at the edge of the wafer.

FIG. 9 shows yield data comparisons, in the form of a bar graph, between the conventional method and the method of this invention. The graph bar on the right 52 shows wafer yields for the conventional method. The bar graph on the left 54 shows wafer yields for the method of this invention. In both the conventional method and the method of this invention the solvent rinses a band about 2 millimeters from the edge of the wafer. For this case the method of this invention improves wafer yield from about 75.7% to about 80.4%.

Figure 10:
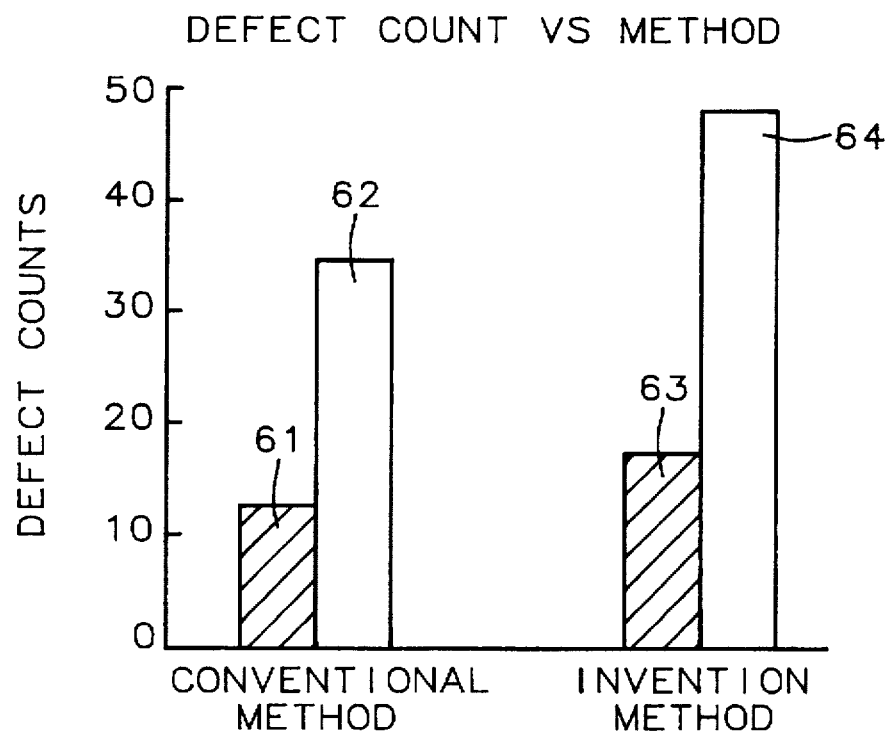
FIG. 10 shows a plot of defect counts for different conditions of treating the dielectric ridge at the edge of the wafer.

FIG. 10 shows defect count data comparisons, in the form of a bar graph, between the conventional method and the method of this invention for the condition where the solvent rinses a band about 2 millimeters from the edge of the wafer. The bars on the left, 61 and 62, show defect counts for the conventional method and the bars on the right, 63 and 64, show defect counts for the method of this invention. The shaded bars, 61 and 63, show defect counts for a region near the flat edge of the wafer. The clear bars, 62 and 64, show defect counts for the overall wafer. The method of this invention reduces the defect count over 42% in the region near the flat edge of the wafer and over 26% for the overall wafer.

While the invention has been particularly shown and described with reference to the preferred embodiments thereof, it will be understood by those skilled in the art that various changes in form and details may be made without departing from the spirit and scope of the invention.

What is claimed is:

1. A method of fabricating integrated circuit wafers:
   providing an integrated circuit wafer having a flat edge and a flat edge region wherein said flat edge region is that part of said integrated circuit wafer between said flat edge and a line parallel to said flat edge;
   forming a layer of dielectric material on said integrated circuit wafer;
   forming a layer of photoresist material over said layer of dielectric material;
   selectively exposing and developing said layer of photoresist thereby forming a photoresist mask by removing that part of said layer of photoresist directly over said flat edge region of said integrated circuit wafer;
   etching away that part of said layer of dielectric material directly over said flat edge region of said integrated circuit wafer by means of wet etching using said photoresist mask; and
   stripping the remaining photoresist from said integrated circuit wafer.

2. The method of claim 1 wherein said layer of dielectric material is a layer of Spin-On-Glass.

3. The method of claim 2 wherein said layer of Spin-On-Glass has a thickness of between about 3700 and 5500 Angstroms.

4. The method of claim 1 further comprising forming a layer of first oxide having a thickness of between about 1600 and 2400 Angstroms on said integrated circuit wafer prior to forming said layer of dielectric material on said integrated circuit wafer.

5. The method of claim 1 further comprising forming a layer of second oxide having a thickness of between about 4000 and 6000 Angstroms on said integrated circuit wafer after stripping the remaining said photoresist from said integrated circuit wafer.

6. The method of claim 1 wherein said integrated circuit wafer has devices formed therein.

7. The method of claim 1 wherein said integrated circuit wafer has patterned metal layers and insulation layers formed thereon.

8. The method of claim 1 wherein said wet etching uses a buffered oxide etch.

9. The method of claim 1 wherein said integrated circuit wafer having a flat edge has the shape of a circle intersected by a chord line wherein said circle has a diameter of between about 4 and 8 inches.

10. The method of claim 1 wherein said line parallel to said flat edge is between about 1 and 3 millimeters away from said flat edge.

11. A method of fabricating integrated circuit wafers:

providing an integrated circuit wafer having a flat edge and a flat edge region wherein said flat edge region is that part of said integrated circuit wafer between said flat edge and a line parallel to said flat edge;

forming a layer of first oxide on said integrated circuit wafer;

forming a layer of dielectric material over said layer of first oxide;

forming a layer of photoresist material over said layer of dielectric material;

selectively exposing and developing said layer of photoresist thereby forming a photoresist mask by removing that part of said layer of photoresist directly over said flat edge region of said integrated circuit wafer;

etching away that part of said layer of dielectric material directly over said flat edge region of said integrated circuit wafer by means of wet etching using said photoresist mask;

stripping said photoresist mask from said integrated circuit wafer; and forming a layer of second oxide on said integrated circuit wafer after stripping said photoresist mask.

12. The method of claim 11 wherein said layer of dielectric material is a layer of Spin-On-Glass.

13. The method of claim 12 wherein said layer of Spin-On-Glass has a thickness of between about 3700 and 5500 Angstroms.

14. The method of claim 11 wherein said layer of first oxide has a thickness of between about 1600 and 2400 Angstroms.

15. The method of claim 11 wherein said layer of second oxide has a thickness of between about 4000 and 6000 Angstroms.

16. The method of claim 11 wherein said wet etching uses a buffered oxide etch.

17. The method of claim 11 wherein said integrated circuit wafer having a flat edge has the shape of a circle intersected by a chord line wherein said circle has a diameter of between about 4 and 8 inches.

18. The method of claim 11 wherein said line parallel to said flat edge is between about 1 and 3 millimeters away from said flat edge.

19. The method of claim 11 wherein said integrated circuit wafer has devices formed therein.

20. The method of claim 11 wherein said integrated circuit wafer has patterned metal layers and insulation layers formed thereon.

* * * * *